United States Patent [19]

Dreiske

[11] 4,131,853

[45] Dec. 26, 1978

[54] ELECTRONIC MULTIPLE CHANNEL TUNER

[75] Inventor: Erwin J. Dreiske, Athens, Tex.

[73] Assignee: Curtis Mathes Manufacturing Co., Athens, Tex.

[21] Appl. No.: 753,601

[22] Filed: Dec. 22, 1976

[51] Int. Cl.² .............................................. H04B 1/26
[52] U.S. Cl. .................................... 325/464; 325/455; 325/459; 358/191
[58] Field of Search ............... 325/453, 455, 459, 464, 325/465, 468, 470; 358/191, 193

[56] References Cited

U.S. PATENT DOCUMENTS

| | | | |
|---|---|---|---|
| 3,654,557 | 4/1972 | Sakamoto et al. | 325/455 |
| 3,737,818 | 6/1973 | Jacob | 334/15 |
| 3,906,351 | 9/1975 | Evans | 325/459 |
| 3,928,808 | 12/1975 | Evans | 325/464 |
| 3,946,319 | 3/1976 | Ma et al. | 325/459 |
| 3,990,027 | 11/1976 | Kawashima | 325/464 |

Primary Examiner—Robert L. Griffin
Assistant Examiner—Marc E. Bookbinder
Attorney, Agent, or Firm—Wegner, Stellman, McCord, Wiles & Wood

[57] ABSTRACT

An electronic tuner, particularly suited for a VHF/UHF television receiver using voltage tuned circuits. A two digit decimal channel selector has a binary coded output. The output representing the channel selected is connected with both a VHF decoder and a UHF decoder which includes a memory programmed for a plurality of UHF channels. A memory scanner and a comparator choose the selected UHF channel from the memory and actuate the tuning means for the selected UHF channel. A UHF programmer directs storage of channel indicia at a selected address in the memory.

15 Claims, 6 Drawing Figures

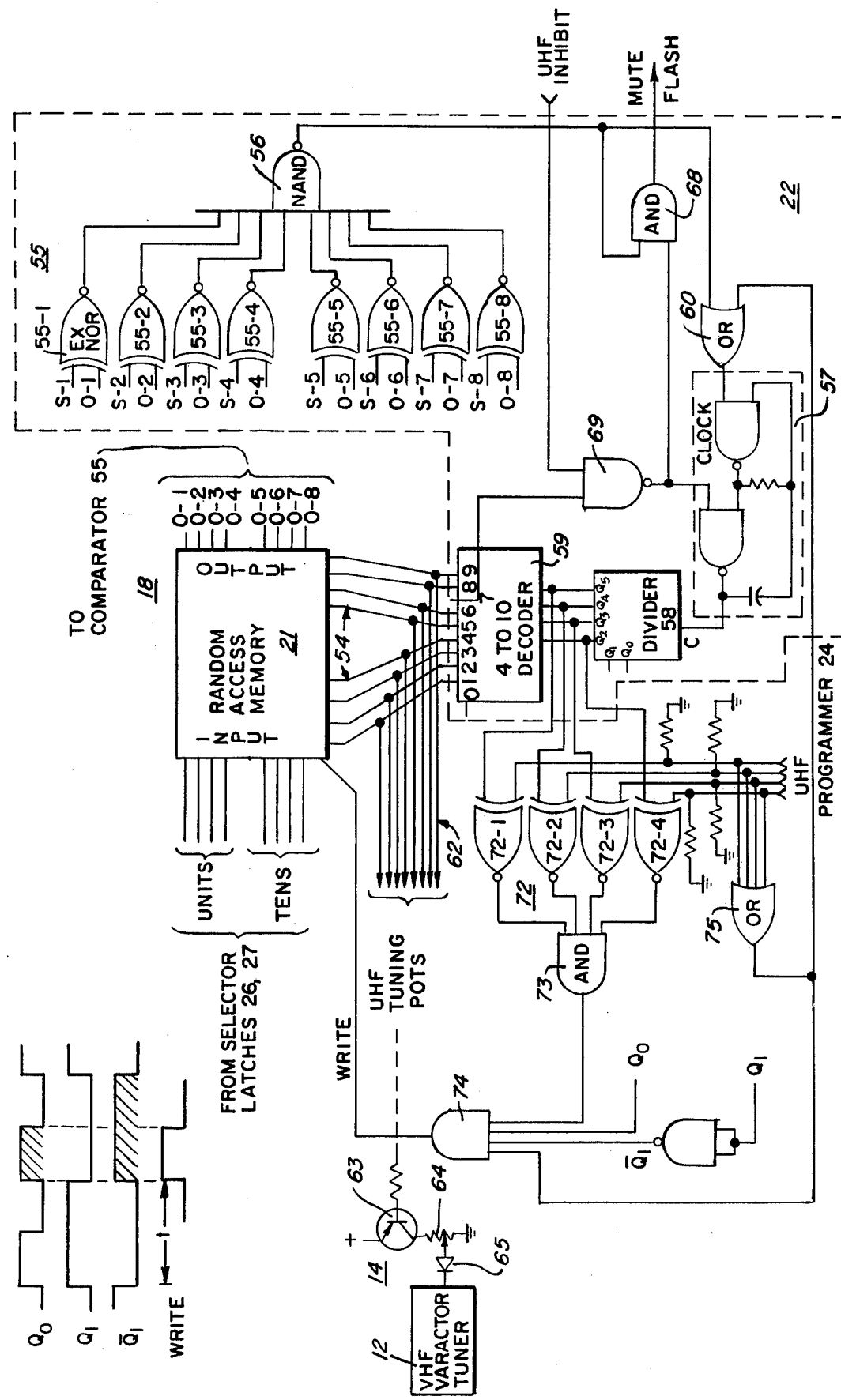
FIG. 4
FIG. 5
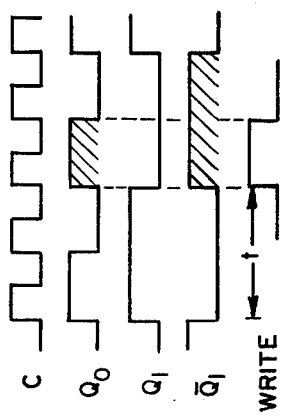

ELECTRONIC MULTIPLE CHANNEL TUNER

SPECIFICATION

This invention is concerned with an electronic selector for a multiple channel tuner and is disclosed as a VHF/UHF tuner for a television receiver.

Many television receiver tuners utilize a voltage controlled oscillator, as, for example, with a varactor element. The channel to be received is determined by the voltage applied to the varactor. It is known to provide a plurality of potentiometers which are preset to voltages corresponding with several channels which may be available in a particular locality. A selected channel is tuned by connecting the voltage from the appropriate potentiometer to the varactor. Proposals have been made for electronic control of such tuners. See, for example, the U.S. patents of Jacobs 3,737,818, Evans 3,906,351, Evans 3,928,808 and Ma et al 3,946,319.

The Evans patents, for example, provide for selection of any one of all 82 television channels. Ma et al discloses a system in which the memory stores information concerning the analog voltage for each channel. These prior systems are unduly complex.

The tuner disclosed herein affords a high degree of tuning flexibility and a capacity sufficient for the limited number of television broadcasting stations available in a given locality with a relatively simple and inexpensive circuit.

One feature of the invention is that the tuner has means for tuning each of a plurality of signal channels, a memory with plural channel indicia stored at discrete addresses, means for selecting a desired signal channel, means for comparing indicia representing the selected channel with the channel indicia of the stored memory and means responsive to the comparing means for actuating the tuning means for the selected channel. More particularly, each address of the memory is scanned and the indicia of the selected channel compared with stored channel indicia. The occurence of coincidence between the selected and stored indicia terminates scanning and actuates the tuning means for the selected channel.

Another feature is that the channel indicia are binary coded two digit decimal numbers and the means for comparing the selected channel indicia with the channel indicia stored in the memory includes a plurality of comparator gates, one for each binary bit.

A further feature of the invention is that the tuner has a means for tuning each of a first set of plural signal channels (e.g., VHF), means for tuning each of a second set of plural signal channels (e.g., UHF), a memory with channel indicia from plural channels of the second set stored at discrete addresses, means for comparing selected channel indicia with the stored channel indicia to actuate tuning means for the second set of channels and means responsive to selection of a channel in the first set to inhibit operation of the comparing means.

Yet another feature is means for programming the tuner memory including means for selecting a channel and for generating channel indicia, means for choosing an address in the memory for storage of the selected channel indicia and means for writing the channel indicia at the chosen address.

Further features and advantages of the invention will readily be apparent from the following specification and from the drawings, in which:

FIG. 4 is a block diagram of a UHF channel decoder and programmer; and

FIG. 5 is a timing diagram for the UHF memory programmer.

The embodiment of the invention illustrated herein is a VHF/UHF television receiver using voltage controlled varactor tuning elements tuned by selecting preset varactor control voltages. The invention has features which may be used in other multi-channel tuners and in tuners using other discrete frequency determining elements.

Figure 1:
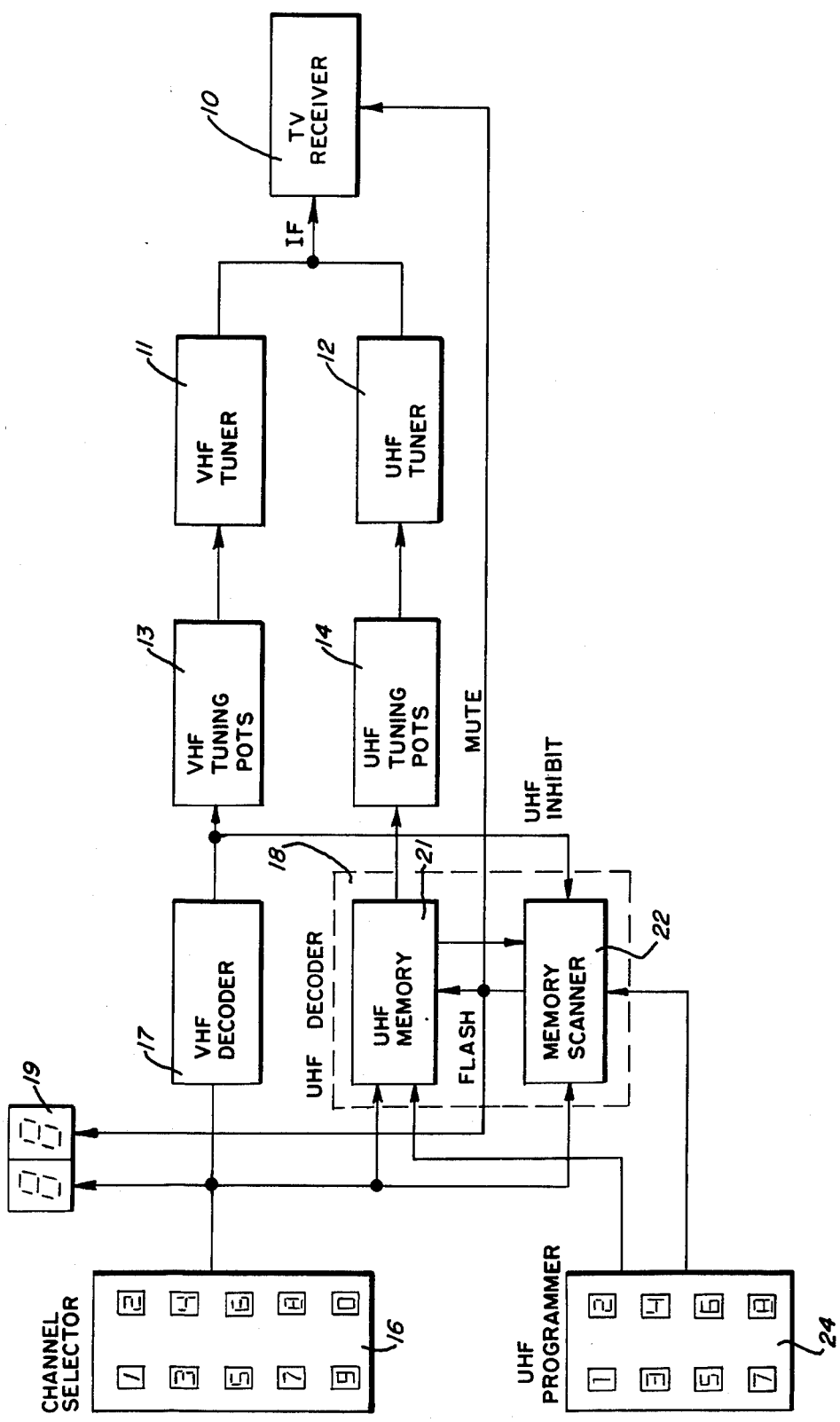
FIG. 1 is a block diagram of a television receiver with a tuner embodying the invention.

FIG. 1 shows a television receiver 10 having a VHF tuner 11 and a UHF tuner 12. Each tuner has an intermediate frequency (IF) output connected to the television receiver. VHF and UHF tuning potentiometers 13, 14 respectively, control frequency selection of the VHF and UHF tuners 11, 12. Each includes a plurality of present potentiometers which are electronically switched into the tuner circuit. A channel selector 16 has touch buttons representing the 10 digits, 1–9 and 0. The output of channel selector 16, indicia representing the selected channel, is connected with VHF decoder 17 and UHF decoder 18 which actuate electronic switching of the tuning potentiometer for the selected channel to the appropriate tuner. A visual display 19 indicates the channel which has been selected.

In accordance with the invention, 12 VHF tuning potentiometers are provided, one for each of the standard VHF channels. The VHF decoder 17, as will appear below, is a straightforward logic circuit. It would unduly complicate the UHF tuner to provide a tuning potentiometer for each of the 70 UHF channels presently used in the United States. Any one area has only a few UHF channels in operation. Accordingly, a lesser number of UHF tuning potentiometers (as 8) are provided. The UHF decoder 18 includes a UHF memory 21 which is programmed with indicia representing the UHF channels for which the UHF tuning potentiometers 14 are adjusted. When a UHF channel is selected, a memory scanner 22 is activated which scans memory 21 and the indicia for the selected channel is compared with the stored indicia. If the selected channel is one for which the memory is programmed, coincidence between the selected channel indicia and the memory indicia stops the scanning operation and actuates the appropriate UHF tuning potentiometer.

An output from VHF decoder 17 serves to inhibit operation of the UHF memory scanner 22 so that it does not function unnecessarily. During operation of the UHF memory scanner 22, the television receiver 10 is muted to reduce noise. In the event a UHF channel is selected for which the memory is not programmed, visual display 19 is caused to flash.

A UHF programmer 24 enables the user to set up the UHF memory 21 and tuning potentiometers 14 for selected UHF channels. Briefly, the channel number is entered in channel selector 16. Then the memory address to be used is entered in programmer 24. This writes the selected channel indicia in UHF memory 21 and also activates the corresponding UHF tuning potentiometer which is then adjusted for the appropriate tuner frequency to receive the selected channel. This procedure is repeated for each of the UHF channels to be programmed. Further details of the circuits will be discussed below.

In the case of a receiver used in connection with a cable television system, the channel frequencies may be offset from those specified by FCC broadcast regulations. The channel tuning potentiometers may be adjusted to accommodate these frequency offsets.

Figure 2A:
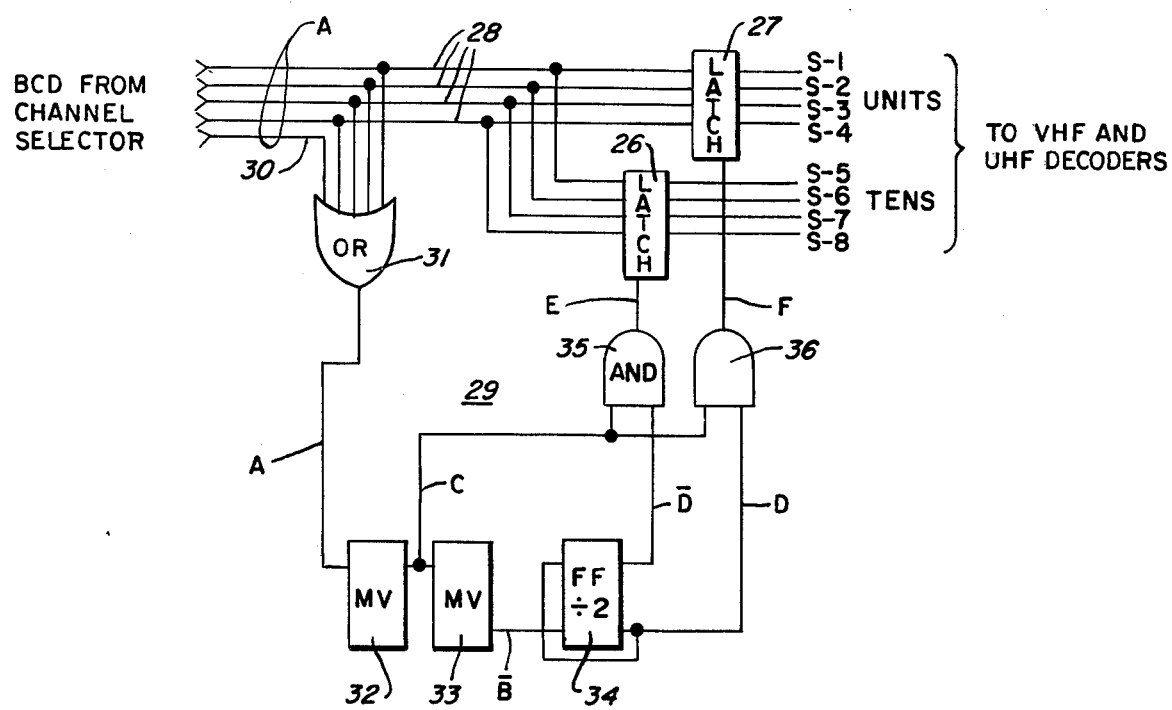
FIG. 2A is a block diagram of a channel indicia latch circuit.
Figure 2B:
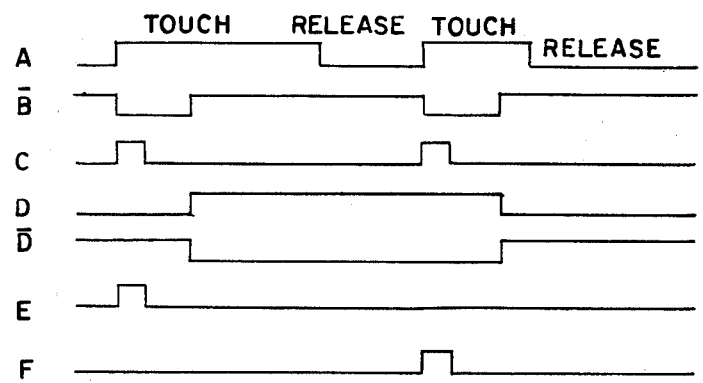
FIG. 2B is a timing diagram for the circuit of FIG. 2A.

The output of channel selector 16 is a binary coded signal representing each of the digits 1–9 and 0. This digital indicia is stored in latch circuits 26, 27 (FIG. 2A) for the tens and units digits, respectively. The outputs of the two latch circuits, on lines designated S-1 through S-8, are connected in parallel with the VHF and UHF decoders 17, 18. The digital channel indicia information from selector 16 on lines 28 is connected not only with latches 26, 27, but also with a timing circuit 29 for strobing the latches. The operation of the timing circuit will be described in connection with the timing diagrams of FIG. 2B where various waveforms are indicated by letters A–F. The corresponding letters indicate the location in the circuit of FIG. 2A where the waveforms appear.

The four indicia signals on lines 28 together with a fifth keying signal on line 30 are connected with OR gate 31. The output of the OR gate is high whenever a key of channel selector 16 is touched as indicated by waveform A. The keying signal of line 30 provides an output from OR gate 31 in the event the indicia on lines 28 is 0000. The input from OR gate 31 actuates a one shot multivibrator 32 which has an output C. This output is connected with a second one shot multivibrator 33 which has an output $\bar{B}$. The output C from multivibrator 32 is a pulse of shorter duration than the output $\bar{B}$ of multivibrator 33. The $\bar{B}$ signal is connected with a frequency divider 34 which has outputs D, $\bar{D}$.

The operator in selecting a channel touches first the tens unit for the selected channel. If one of channels 2–9 is desired, the tens unit is 0. So long as the key of the channel selector is touched, the indicia for the touched digit appears on lines 28. The output C of multivibrator 32 goes high and together with $\bar{D}$ actuates AND gate 35 which has an output E operating latch 26 to store the tens digit indicia. When $\bar{B}$ goes high, divider 34 is actuated and D goes high. The tens digit is released and the units digit touched establishing the appropriate indicia on lines 28. The C and $\bar{B}$ pulses are repeated. C and D actuate AND gate 36, output F strobing units latch 27. The selected channel indicia remain at the outputs of latches 26, 27 until another channel is selected.

Figure 3:
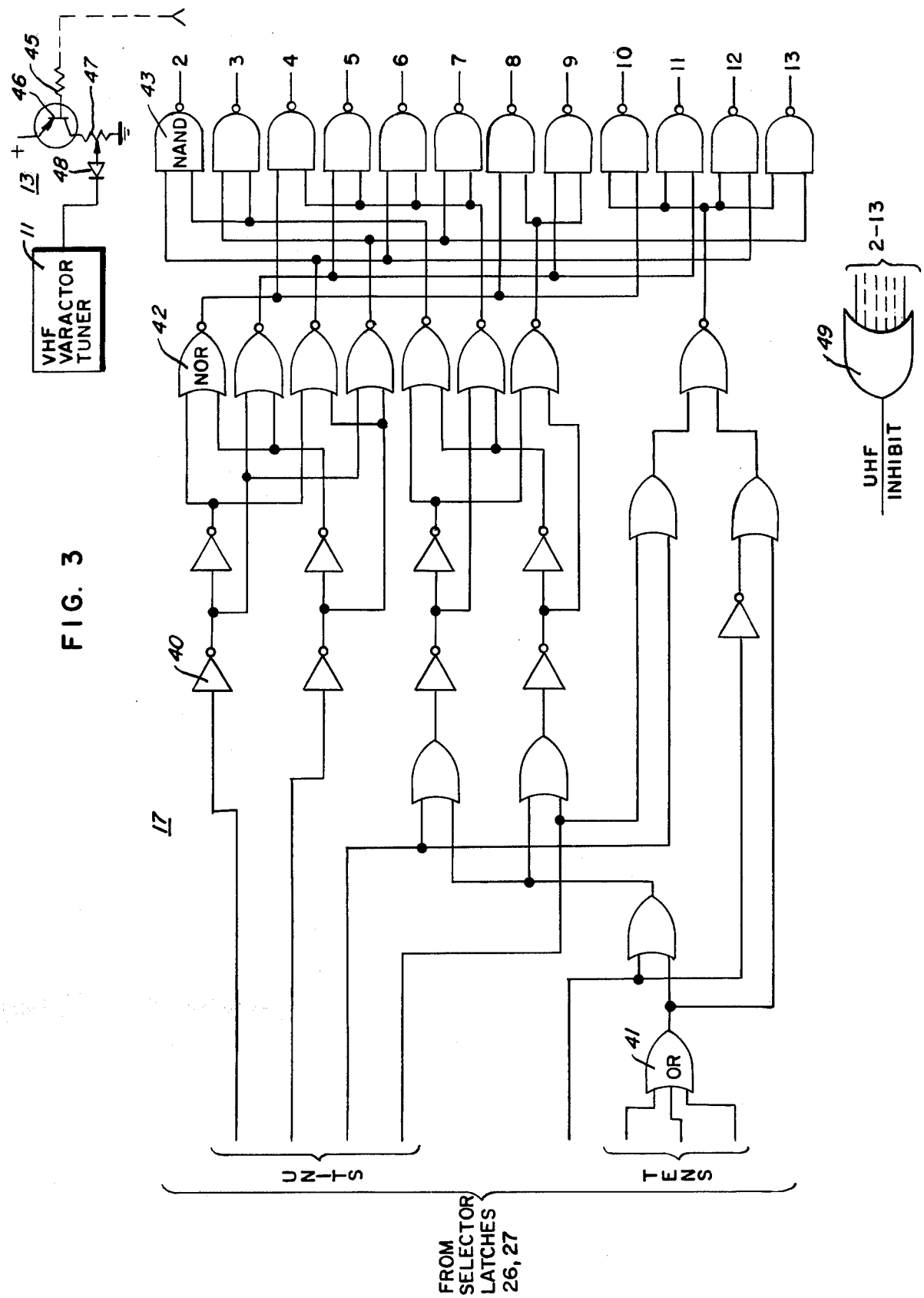
FIG. 3 is a block diagram of a VHF channel decoder.

The VHF decoder illustrated in FIG. 3 utilizes a series of inverters 40, OR gates 41, NOR gates 42 and NAND gates 43 to determine the selected VHF channel. There are 12 NAND gates 43 and their outputs represent VHF channels 2–13. The decoder logic is known and the circuit will not be described in detail. It is shown to illustrate an operative embodiment of a tuner. The output of each NAND gate 43 is connected with a tuning potentiometer switch, one of which is illustrated in FIG. 3. The NAND gate output is connected through a resistor 45 with the base of a switch transistor 46 connected in series between a positive voltage source and potentiometer 47. The tap of potentiometer 47 is connected through an isolating diode 48 with VHF varactor tuner 11. The occurrence of an output from one of NAND gates 43 connects the appropriate control potential with the VHF varactor tuner.

The outputs of the 12 NAND gates 43 are also connected as inputs to OR gate 49, the output of which provides the UHF inhibit signal mentioned in connection with FIG. 1.

FIG. 4 shows UHF decoder circuit 18. Random access memory 21 stores the binary coded decimal channel indicia for the UHF channels. As pointed out above, eight UHF channels are suitable for a television receiver tuner. The memory has eight storage addresses which are individually connected with the memory output lines 0-1 through 0-8 by the application of a potential to the appropriate one of address lines 54. The manner of programming the channel indicia in the memory is described below. For the following discussion of the UHF tuner operation, it will be assumed that the memory has already been programmed.

Upon initiation of channel selection by the entry of the selected channel number on channel selector 16, the binary coded decimal indicia from channel selector latches 26, 27 on lines S-1 through S-8 are connected as inputs to comparator 55, eight EX-NOR gates, 55-1 through 55-8. The binary coded decimal indicia from memory 21 on lines 0-1 through 0-8 are connected to the other inputs of each of EX-NOR gates 55-1 through 55-8. The memory is scanned, as will appear, to compare the indicia at each address with the selected channel indicia.

The output of each EX-NOR gate is high only if both inputs to that gate are the same. Thus, if the selected channel indicia coincides with the channel indicia from memory 21, the outputs of all the EX-NOR gates are high. The EX-NOR outputs are connected as inputs of NAND gate 56. When all of the NAND inputs are high, the output of the NAND is low. Conversely, if any of the channel indicia from selector latches 26, 27 and memory 21 do not coincide, one or more of the EX-NOR outputs is low and the output of NAND 56 is high.

Clock 57 controls the scanning of memory 21. The clock may have a frequency of the order of 12 KHz. The clock output is connected with dividers 58 which has outputs $Q_1$ through $Q_5$. $Q_0$ is at one-half the frequency of the clock, $Q_1$ at one-half the frequency of $Q_0$, etc. The frequency of $Q_5$ is 1/64 the clock frequency. Divider outputs $Q_2$ through $Q_5$ are connected with a four to ten decoder 59 which has sequential outputs 0 through 9 at a frequency of 1.5 KHz for a clock frequency of 12 KHz. Outputs 1 through 6, 8 and 9 provide the memory scanning address potentials at lines 54 and are also connected with each of the switches for the UHF tuning potentiometers 14, as will appear. The 7 output of decoder 59 serves another purpose as will be explained below.

Upon selection of a channel, one or more of the outputs of exclusive NOR comparator 55 is low and the output of NAND gate 56 is high. This signal is applied to an input of OR gate 60 which causes operation of clock 57. The eight address positions of random access memory 21 are scanned sequentially. If the channel which has been selected is a UHF channel for which the memory is programmed, coincidence of inputs of comparator 55 will occur and the output of NAND gate 56 goes low, stopping clock 57.

The output of decoder 59 remains on the address line for the memory address in which the channel indicia corresponding with the selected channel indicia is stored. The decoder output potential is also applied through one of lines 62 to a transistor switch 63 for potentiometer 64. The tap of the potentiometer is adjusted for the frequency of the selected UHF channel and connected through isolating diode 65 with UHF varactor tuner 12. A separate switch and potentiometer is provided for each of the eight UHF channels.

During the scanning operation, a high condition is present at both inputs of AND gate 68, providing a mute control for the television receiver 10. If the UHF channel which has been selected is not programmed in memory 21, clock 57 continues to operate repeatedly scanning the memory. The output of AND gate 68 is also connected with a flash control for channel display 19 alerting the user to the entry of an incorrect channel number.

In the event the channel selected is a VHF channel, the UHF inhibit output of OR gate 49, FIG. 3, is applied to an input of NAND gate 69. The other input of NAND gate 69 is connected with the unused decoder output 7. When the scanning reaches position 7, the output of NAND gate 69 goes low stopping clock 57.

Channel indicia are stored in memory 21 by use of UHF programmer 24. The channel number is entered in channel selector 16 and the binary coded decimal indicia representing the channel appears at the memory input. The memory address to which the channel is assigned is chosen by actuation of the appropriate button 1 through 8 of UHF programmer 24. The output of programmer 24 is a binary coded signal applied to inputs of coincidence gate 72 which determines when the chosen memory location is addressed. Coincidence gate 72 includes four EX-NOR gates 72-1 through 72-4. One input of each EX-NOR gate 72-1 through 72-4 is connected with each output of UHF programmer 24 and the other input of each gate is connected with one of the outputs $Q_2$ through $Q_5$ of divider 58. As the $Q_2$ through $Q_5$ outputs from the divider are decoded to scan the memory, a comparison of these outputs with the binary representation of the chosen address indicates when the chosen address is selected by the decoder output.

The outputs of coincidence gates 72 are connected with AND gate 73 and the output of the AND gate goes high when the inputs of each EX-NOR gate are the same. The output of AND gate 73 is connected with an input of WRITE AND gate 74. The other inputs of AND gate 74 are derived from the $Q_0$, $Q_1$ outputs of divider 58, generating a WRITE pulse a period of time t after the initiation of the $Q_1$ pulse. This insures that the signals from coincidence gate 72 are stable before the WRITE pulse occurs to enter input data in the memory. OR gate 75 has inputs connected with the binary output of UHF programmer 24 and an output connected with the clock gate 60, insuring that clock 57 operates during the programming procedure.

I claim:

1. A multiple channel tuner, comprising:
   means for tuning each of a plurality of signal channels;
   a memory with plural channel indicia stored at discrete addresses, the tuning means for each channel being operatively associated with the respective memory address;
   means for selecting a desired signal channel and for generating channel representing indicia corresponding thereto;
   means for comparing the selected channel representing indicia with channel indicia stored at various addresses in said memory; and
   means operative if the selected channel representing indicia corresponds with stored channel indicia, and responsive to said comparing means for actuating the tuning means for the selected channel.

2. The tuner of claim 1 in which the comparing means includes:
   means for scanning each address of the memory; and
   means responsive to coincidence between the selected and stored channel representing indicia for terminating memory scanning.

3. The tuner of claim 2 in which the tuner is a part of a signal receiver and including means to disable said receiver during scan of said memory.

4. The tuner of claim 2 including means to indicate continued operation of said scanning means.

5. The tuner of claim 1 including means responsive to the selected channel representing indicia providing a visual display of identification of the selected channel.

6. The tuner of claim 4 including means responsive to the selected channel representing indicia providing a visual display of the selected channel and in which the means to indicate continued operation of the scanning means comprises means for flashing said visual display.

7. The tuner of claim 1 wherein said channel indicia are binary coded two-digit decimal numbers and the means for comparing the selected channel representing indicia with channel indicia stored in the memory includes a plurality of comparator gates for each binary bit, each gate having one input connected with the channel selecting means and the other input connected with said memory.

8. The tuner of claim 2 in which the means for scanning each address of the memory includes a clock; and
   means responsive to coincidence between selected channel representing indicia and the memory indicia to stop said clock.

9. A multiple channel tuner comprising:
   means for tuning each of a first set of plural signal channels;
   a memory with channel indicia for plural channels from said second set of signal channels stored at discrete addresses, the tuning means for the second set of signal channels being operatively associated with the respective memory addresses;
   means for selecting a desired signal channel from either of said sets and for generating indicia corresponding thereto;
   means for comparing the selected channel indicia with channel indicia stored at various addresses in said memory;
   means coupled to said comparing means responsive to coincidence of the selected and stored channel indicia for actuating the tuning means for the selected channel;
   means responsive to indicia representing one of said first set of signal channels to actuate the tuning means therefor; and
   means responsive to selection of a channel in said first set of signal channels to inhibit operation of said comparing means.

10. The tuner of claim 9 for a television receiver in which said first set of signal channels are the VHF television channels and the second set of signal channels are the UHF signal channels.

11. A multiple channel television receiver tuner, comprising:
    means for tuning each of plural VHF signal channels;
    means for tuning each of plural UHF signal channels;

a two digit decimal keyboard for selecting a desired signal channel, said keyboard having a binary coded decimal coded channel;

a VHF channel indicia decoder connected with said keyboard;

means responsive to said VHF decoder to actuate a selected VHF channel tuning means;

a memory with binary coded decimal UHF channel indicia for plural UHF channels stored at discrete addresses, the tuning means for the UHF signal channels being operatively associated with the respective memory addresses;

means for comparing the selected channel indicia from the keyboard with channel indicia stored at various addresses in said memory; and means responsive to coincidence of the selected and stored indicia for actuating the tuning means for the selected UHF channel.

12. The tuner of claim 11 including means responsive to an output of said VHF channel decoder for inhibiting operation of the UHF channel comparing means.

13. In a multiple channel tuner having a plurality of discrete tuning means each adjustable for tuning one of a plurality of signal channels and a memory for storing indicia identifying the channel for which each tuning means is adjusted, each of said tuning means being associated with an address in said memory, whereby on selection of a channel, the memory identifies the tuning means therefor, improved means for programming said memory, comprising:

means for selecting a channel and for generating channel indicia identifying the selected channel;

means independent of the channel selecting means for choosing an address in said memory for the selected channel indicia, said memory having a capacity to store indicia for fewer than all said plurality of signal channels; and means for writing said selected channel indicia at said chosen address, including means for scanning addresses in said memory and means for writing said selected channel indicia in said memory when the scanned address corresponds with the chosen address.

14. The memory programmer of claim 13 in which the means for scanning said memory includes a clock; and means responsive to actuation of said address choosing means to initiate operation of the clock.

15. The memory programming means of claim 13 including:

means for comparing each scanned memory address with the chosen address; and means responsive to agreement between the scanned address and the chosen address to write the channel indicia in the memory.

* * * * *